(12) United States Patent
Lee

(10) Patent No.: US 11,456,032 B2
(45) Date of Patent: Sep. 27, 2022

(54) SYSTEMS AND METHODS FOR MEMORY CELL ACCESSES

(71) Applicant: Micron Technology, Inc., Boise, ID (US)

(72) Inventor: Yen Chun Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/162,031

(22) Filed: Jan. 29, 2021

(65) Prior Publication Data
US 2022/0246209 A1 Aug. 4, 2022

(51) Int. Cl.
*G11C 13/00* (2006.01)
(52) U.S. Cl.
CPC ........ *G11C 13/003* (2013.01); *G11C 13/0004* (2013.01); *G11C 13/0028* (2013.01); *G11C 13/0038* (2013.01)
(58) Field of Classification Search
CPC .............. G11C 13/003; G11C 13/0004; G11C 13/0028; G11C 13/0038
See application file for complete search history.

(56) References Cited

U.S. PATENT DOCUMENTS

| | | | | |
|---|---|---|---|---|
| 2003/0086314 A1* | 5/2003 | Okazawa | ............ | G11C 11/1673 365/200 |
| 2004/0228163 A1* | 11/2004 | Khouri | ............... | G11C 13/0069 365/154 |
| 2011/0122680 A1* | 5/2011 | Ikeda | ...................... | H01L 27/24 365/148 |
| 2011/0194360 A1* | 8/2011 | Yamada | ................. | G11C 29/02 365/201 |
| 2013/0194868 A1* | 8/2013 | Hashimoto | ............ | G11C 29/82 365/185.11 |
| 2018/0122466 A1* | 5/2018 | Terada | ............... | G11C 13/0023 |
| 2020/0105345 A1* | 4/2020 | Baek | ................... | G11C 13/0033 |
| 2021/0005253 A1* | 1/2021 | Lim | ................... | G11C 13/0028 |
| 2021/0118502 A1* | 4/2021 | Janjua | ................ | G11C 13/0004 |

* cited by examiner

*Primary Examiner* — Khamdan N. Alrobaie
(74) *Attorney, Agent, or Firm* — Fletcher Yoder, P.C.

(57) ABSTRACT

A memory device includes a plurality of memory elements. The memory device additionally includes a first current mirror that when in operation selectively outputs a first current to select a target memory cell as a first memory element of the plurality of memory elements. The memory device further includes a second current mirror that when in operation selectively outputs a second current to select the target memory cell as the first memory element of the plurality of memory elements.

22 Claims, 6 Drawing Sheets

SYSTEMS AND METHODS FOR MEMORY CELL ACCESSES

BACKGROUND

Field of the Present Disclosure

Embodiments of the present disclosure relate generally to the field of semiconductor devices. More specifically, embodiments of the present disclosure relate to improvements in the access of a target cell in memory, for example, in a phase-change memory.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

Memory device technologies have continued to evolve. For example, dynamic random-access memory (DRAM) is a type of memory that may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

Other types of memory has been developed, for example, phase change memory. Phase change memory is a non-volatile memory that typically utilizes materials that change state. The changing of one state to another (e.g., a crystalline phase having a relative low resistance to an amorphous phase having relative high resistance) may be controlled through the application of, for example, heat to the materials of the phase change memory. The states themselves, based on their differences in resistivity, represent whether the phase change memory cell stores "1" or "0" as a binary value. As phase change memory continues to grow in usage, techniques to increase the efficiency of accesses of the phase change memory are desirable.

BRIEF DESCRIPTION OF DRAWINGS

FIG. 7 is a flowchart of a method of selection and programming of the target memory cell if FIG. 6, in accordance with an embodiment of the present disclosure.

DETAILED DESCRIPTION

Figure 1:
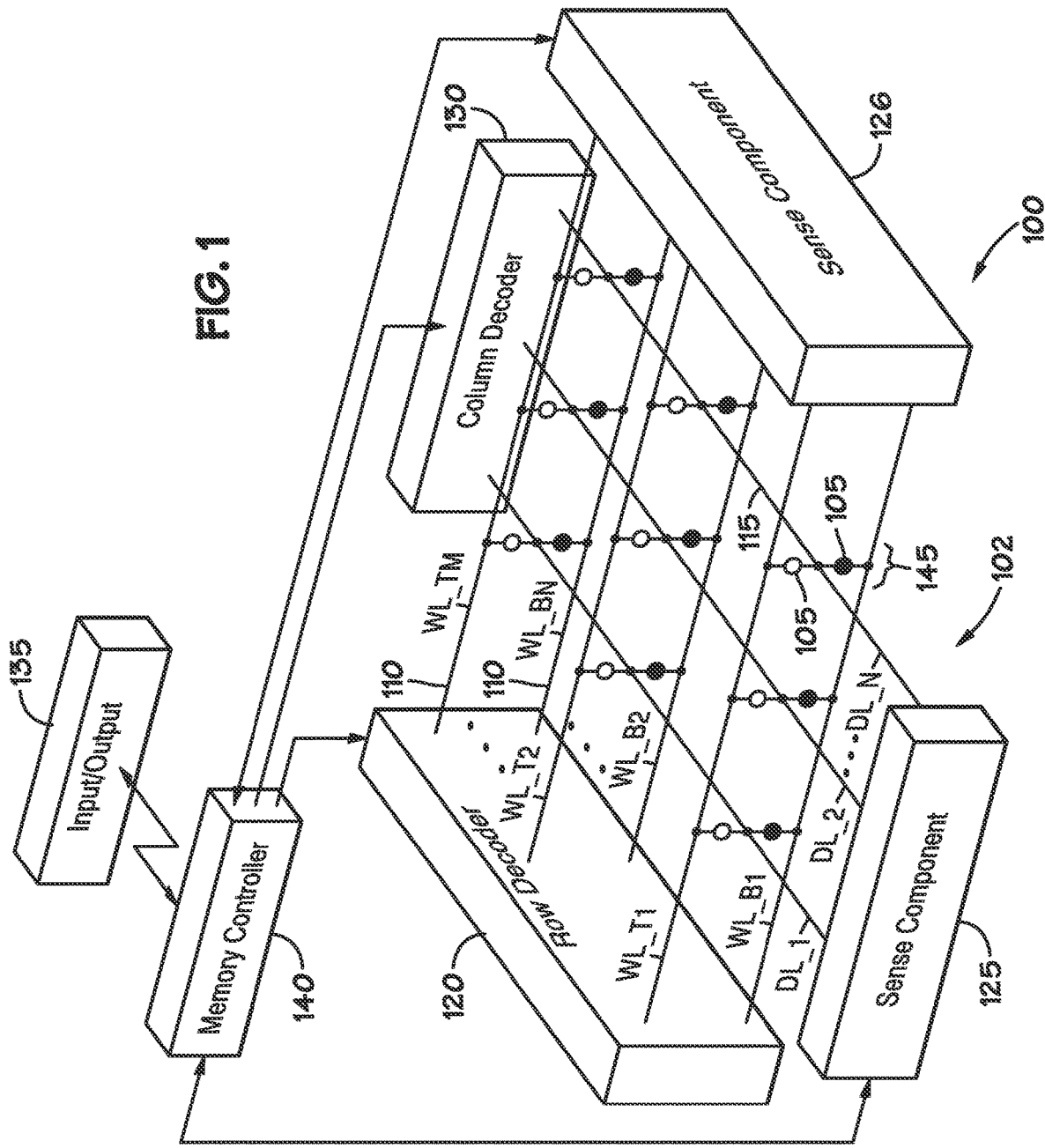
FIG. 1 is an example of a memory device including memory cells, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memory (RAM) devices, dynamic RAM (DRAM) devices, static RAM (SRAM) devices, flash memories, and/or phase change memory (PCM) devices.

With respect to PCM devices, selection of target memory cells and their subsequent programming are of importance to configure or otherwise set-up the device. However, there may arise issues stemming from the memory device itself (e.g., leakage currents) that preclude proper selection of a target memory cell. Accordingly, present techniques and circuitry are introduced to allow for more efficient and reliable memory cell selection and subsequent programming. In one embodiment, two or more selection (and/or nucleation) current mirrors may be utilized to allow for tailored current outputs. Selection of a particular current mirror may be based on characteristics of the target memory cell, such as its proximity to a column decoder and/or a row decoder of the memory device. These characteristics may influence the amount of current to be supplied to the target cell to snap the target memory cell.

In other embodiments, one or more selection voltage sources may additionally be utilized to ramp up voltage outputs to generate the tailored current outputs. The one or more selection voltage sources may be source followers and may be advantageous in that they are less sensitive to array leakage (e.g., relative to current mirrors). Additionally, utilizing source followers as the two or more selection voltage sources may provide a faster ramp rate for the voltage outputs relative to, for example, current mirrors.

In some embodiments, a combination of one or more current mirrors and one or more voltage sources may be utilized to ramp up voltage outputs more quickly and provide tailored current outputs. That is, the one or more current mirrors and the one or more voltage sources may provide multiple different combinations available to provide current to the target cell.

Additionally, word line or bit line snap detection circuitry may be utilized in some embodiments to allow for dynamic snap detection of a target memory cell. In some embodiments, snap detection circuitry may determine if appropriate voltage has been provided to induce a snap within the target memory cell. The snap detection circuitry may be coupled to multiple memory arrays containing multiple memory cells. In some embodiments, the snap detection circuitry may count an amount of cells that snap and utilize the percentage of cells that snapped versus cells that did not snap to adjust future selection current biasing. By using dynamic snap detection, transitions from a selection operation to a programming operation of the target memory cell may be expedited relative to the use of a predetermined sense operation at a predetermined time scheduled without feedback of the actual snap of the target memory cell. This may allow for reductions in energy consumption and can reduce spike current in a target memory cell.

Through the use of two or more selection (and/or nucleation) current mirrors and/or selection voltage sources and/or utilizing dynamic snap detection having counter based detection, the efficiency of the memory device may be improved, power consumption may be decreased (as the two of more selection and/or nucleation current mirrors may be coupled to voltages having differing values), longevity of the memory device may be extended, for example by reducing current spikes by using correlating particular current mirrors and/or current levels with respective memory cells having particular characteristics, and other advantages as well may be achieved.

Turning now to the figures, FIG. 1 illustrates an example memory device 100 (or system) in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, be a PCM cell (e.g., a 3D XPoint memory cell). Furthermore, although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the 3D memory array 102 includes two levels of memory cells 105; however, the number of levels may not be limited to two and may, for example, include a greater number of levels. Each level may be aligned or positioned such that memory cells 105 may be aligned (exactly, overlapping, or approximately) with one another across each level, forming a memory cell stack 145. In some cases, the memory cell stack 145 may include two PCM cells (e.g., two 3D XPoint memory cells) with one disposed above the other another.

In some embodiments, each row of memory cells 105 is connected to a word line (e.g., a word line 110), and each column of memory cells 105 is connected to a bit line 115. Word lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations are envisioned, for example, a third layer may share a word line 110 with a lower layer. In general, one memory cell 105 may be located at the intersection of two conductive lines such as a word line 110 and a bit line 115. This intersection may be referred to as a address of the memory cell 105. A target memory cell may be a memory cell 105 located at the intersection of an energized word line 110 and bit line 115; that is, word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells.

Figure 2:
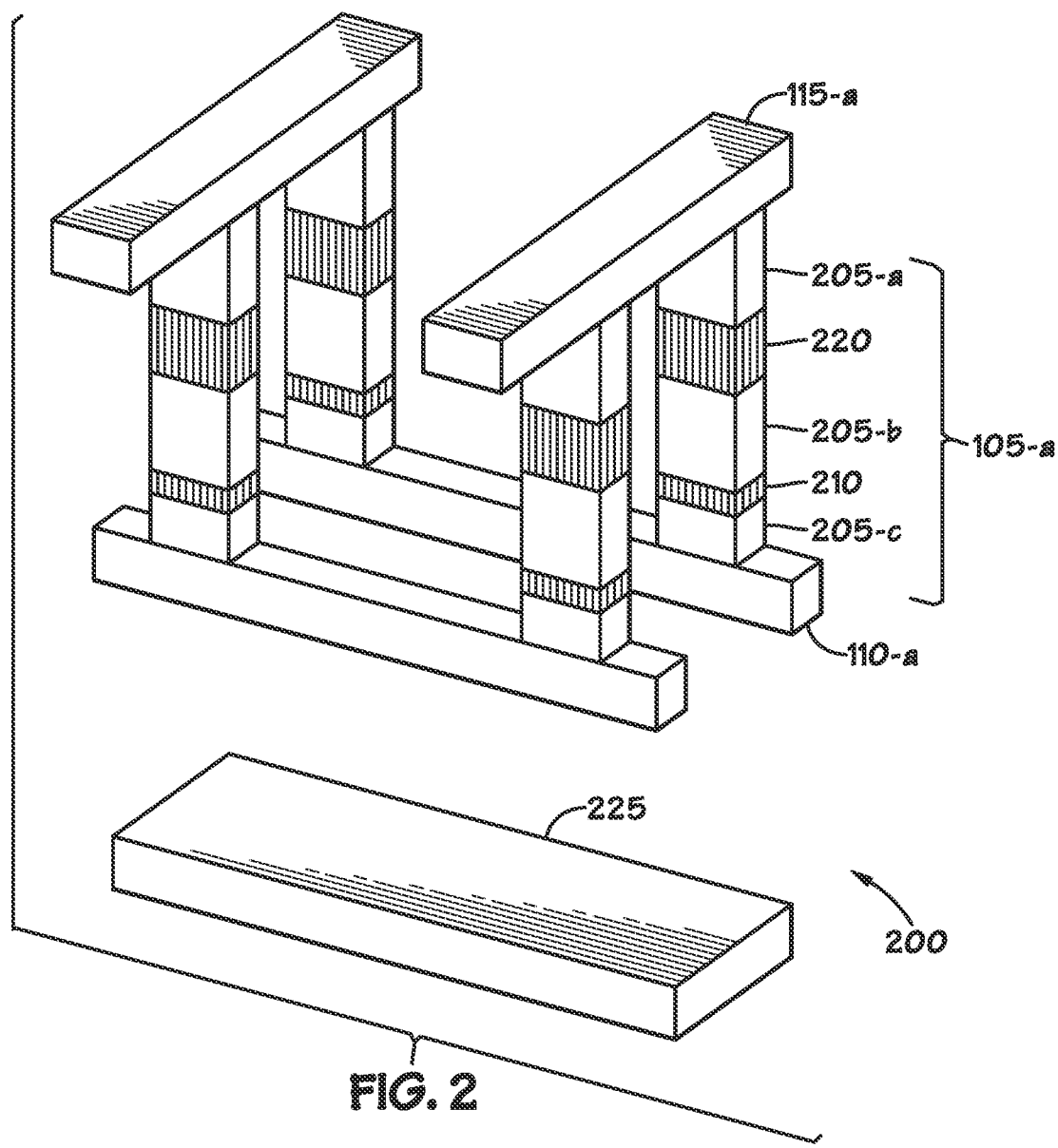
FIG. 2 is an example of a memory array of the memory device of FIG. 1 including memory cells in accordance with an embodiment of the present disclosure.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to a word line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different materials. In other embodiments, the memory cell 105 may include an additional electrode to separate the chalcogenide alloy into two parts, as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting a word line 110 and a bit line 115. In some embodiments, word lines 110 may also be known as access lines and bit lines 115 may also be known as digit lines. References to word lines and bit lines, or their analogues, are interchangeable without loss of understanding or operation. Energizing or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor, or the resistance of the chalcogenide material(s) in the storage portion of the memory cell 105) may be electrically isolated from the bit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding bit line 115. The bit line 115 may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3D XPoint memory cell or a self-selecting memory (SSM) cell, both having two terminals and may not need a separate selection component. As such, one terminal of the 3D XPoint memory cell or the SSM cell may be electrically connected to a word line 110 and the other terminal of the 3D XPoint memory cell or the SSM cell may be electrically connected to a bit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate bit line 115. For example, the 3D memory array 102 may include multiple word lines 110, labeled WL_B1 (or WL_T1) through WL_BM (or WL_TM), and multiple bit lines 115, labeled DL_1 through DL_N, where M and N depend on the array size. Thus, by energizing a word line 110 and a bit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, the sense component 125 may be part of a column decoder 130. Or, the sense component 125 may be connected to or in electronic communication with the column decoder 130. FIG. 1 also illustrates sense component 126. Sense component 126, as illustrated, is coupled to the word lines 110 and for example, operates in conjunction with the row decoder 120. For example, the sense component 126 may operate in conjunction with the row decoder 120 a manner similar to the sense component 125 as described above. Additionally, as will be described in greater detail below, the sense component 126 may also include circuitry to perform additional operations that are not performed via the sense component 125, for example, snap detection of a target memory cell of the 3D memory array 102. In some cases, sense component 126 may be part of a column decoder 130. Alternatively, sense component 126 may be connected to or in electronic communication with column decoder 130.

As briefly outlined above, a memory cell 105 may be set or written by similarly energizing the relevant word line 110 and bit line 115 and at least one logic value may be stored in the memory cell 105. The column decoder 130 and/or the row decoder 120 may accept data, for example input/output 135, to be written to one or more memory cells 105. In some memory architectures, accessing the memory cell 105 may degrade or destroy the stored logic state and re-write or refresh operations may be performed to return the original logic state to memory cell 105. In DRAM, for example, the capacitor of a memory cell 105 may be partially or completely discharged during a sense operation, corrupting the stored logic state. So, the logic state may be re-written after a sense operation. Additionally, energizing a single word line 110 may result in the discharge of all memory cells 105 in the row; thus, several or all memory cells 105 in the row may need to be re-written. However, in other non-volatile memory, such as SSM, PCM (e.g., 3D XPoint memory), FeRAM, or 3D NAND memory, accessing the memory cell 105 may not destroy the logic state and, thus, the memory cell 105 may not require re-writing after accessing.

In operation, the memory controller 140 may control the operation (e.g., read, write, re-write, refresh, discharge) of memory cells 105 through the various components, for example, row decoder 120, column decoder 130, sense component 125, and sense component 126. In some cases, one or more of the row decoder 120, column decoder 130, sense component 125, and sense component 126 may be co-located with the memory controller 140. The memory controller 140 may generate row and column address signals in order to energize the desired word line 110 and bit line 115. The memory controller 140 may also generate and control various voltages or currents used during the operation of memory device 100.

The memory controller 140 may receive user data through the input/output 135, which may be a physical connection or a path coupled to a connector of the memory device 100. In some embodiments, the memory controller 140 may read a previous user data from the memory cells and write a new user data and merge the new user data with the previous user data into write registers. Thereafter, mask register (MR) information may be generated, wherein the mask register information may indicate bits of the previous user data stored in the memory cells to be switched or not to be switched in their logic values. In some embodiments, the memory controller 140 may count numbers of a first logic value (logic "0") and a second logic value (logic "1") to be written using the MR information, respectively, and store the numbers of the first logic value and the second logic value into a first counter and a second counter, respectively. In some embodiments, the memory controller 140 may apply a programming pulse to the memory cells 105 according to the mask register information.

In general, the amplitude, shape, polarity, and/or duration of an applied voltage or current discussed herein may be adjusted or varied and may be different for the various operations discussed in operating the memory device 100. For example, during an access operation, such as a reset operation, a set operation and/or a read operation, a current and/or a voltage may be adaptively controlled. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 200 that supports selective current mirror control in accordance with embodiments of the present disclosure. The memory array 200 may be an example of portions of memory array 102 described with reference to FIG. 1. As depicted in FIG. 2, the memory array 200 includes multiple materials to construct a memory cell 105-*a*. Each memory cell 105-*a* is stacked in a vertical direction (e.g., perpendicular to a substrate) to create memory cell stacks (e.g., the memory cell stack 145). The memory cell 105-*a* may be an example of a memory cell 105 described with reference to FIG. 1. Memory array 200 may thus be referred to as a 3D memory array. The architecture of memory array 200 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

The memory array 200 also includes word lines 110-*a* and bit lines 115-*a*, which may be examples of word line 110 and bit line 115 described with reference to FIG. 1. Illustration of the materials between the word lines 110-*a* and the bit lines 115-*a* depicted in FIG. 2 may represent a lower portion of the memory cell 105 in FIG. 1. Memory array 200 includes electrodes 205, logic storage elements 210, selector device elements 220, and a substrate 225. In some examples, a single component including a chalcogenide alloy (not shown, replacing selector device element 220, logic storage element 210, and electrode 205-*b*) may act as both a logic storage element and a selector device. Electrode 205-*a* may be in electronic communication with bit line 115-*a* and electrode 205-*c* may be in electronic communication with word line 110-*a*.

Insulating materials depicted as empty spaces may be both electrically and thermally insulating. As described above, in PCM technology, various logic states may be stored by varying the electrical resistance of the logic storage element 210 in memory cells 105-*a*, which in turn exhibiting varying threshold voltages of the memory cells 105-*a*. In some cases, storing various logic states includes passing a current through the memory cell 105-*a*, heating the logic storage element 210 in memory cell 105-*a*, or melting (e.g., wholly or partially) the material of the logic storage element 210 in memory cell 105-*a*. Other storage mechanisms, such as threshold voltage modulation, may be exploited in chalcogenide-based memories.

In some cases, memory array 200 may include an array of memory cell stacks, and each memory cell stack may include multiple memory cells 105-*a*. Memory array 200 may be made by forming a stack of conductive materials, such as word lines 110-*a*, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-*a* and bit lines 115-*a* such that each memory cell 105-*a* may be coupled with a word line 110-*a* and a bit line 115-*a*.

The selector device element 220 may be connected with the logic storage element 210 through electrode 205-*b*. In some examples, the positioning of the selector device element 220 and the logic storage element 210 may be flipped. The composite stack including the selector device element 220, the electrode 205-*b*, and the logic storage element 210 may be connected to a word line 110-*a* through the electrode 205-*c* and to a bit line 115-*b* through the electrode 205-*a*. The selector device element 220 may aid in selecting a particular memory cell 105-*a* or may help prevent stray currents from flowing through non-selected memory cells 105-*a* adjacent to a selected memory cell 105-*a*. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-*a* of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-*a* may be heated by passing a current through the memory cell 105-*a*. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-*a* may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

Figure 3:
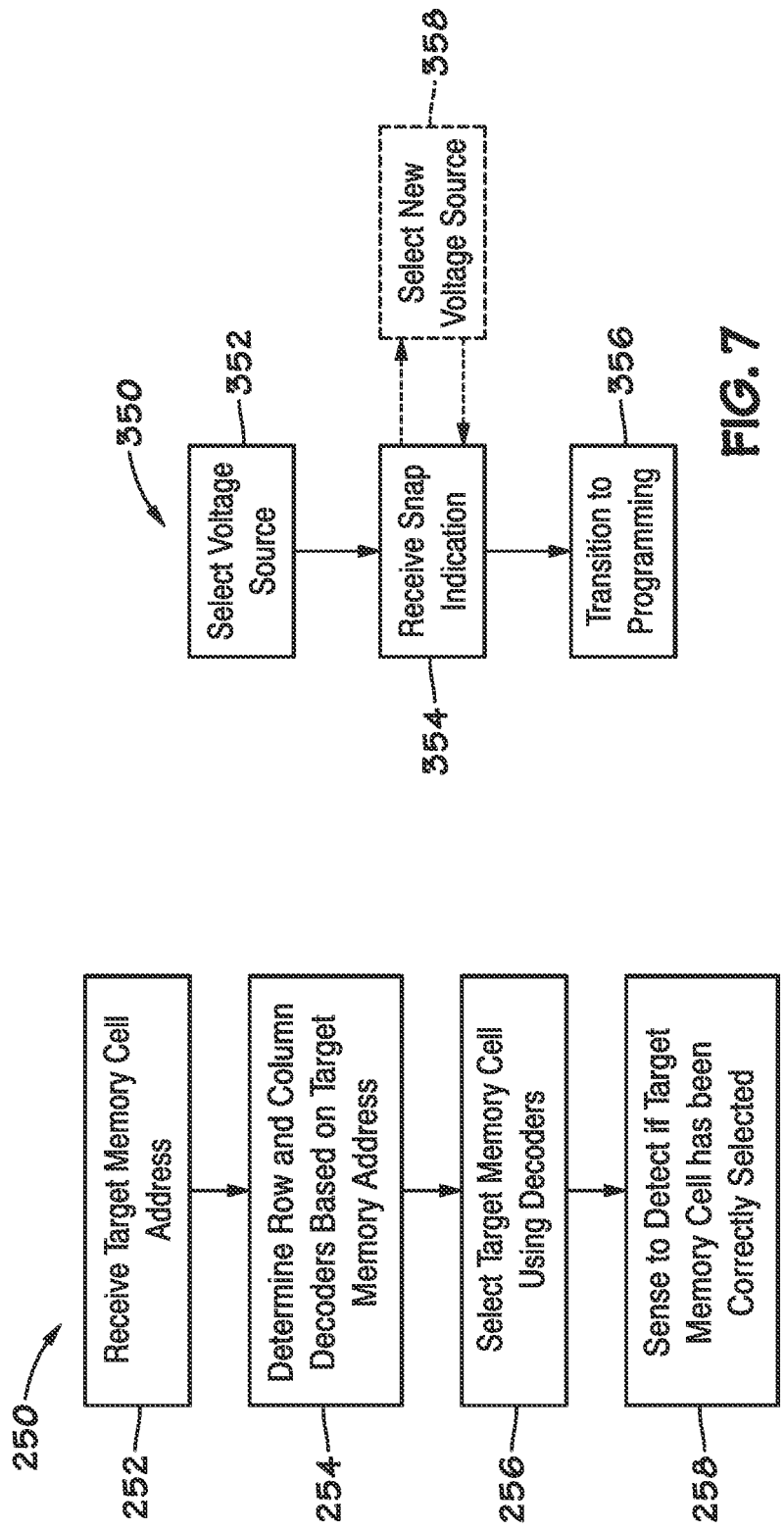
FIG. 3 is a flowchart of a process for selecting a memory cell from the memory array of FIG. 2 using dual terminating bit lines and/or word lines to drive signals, in accordance with an embodiment of the present disclosure.

FIG. 3 is a flowchart of a method 250 for selecting a target memory cell from a set of memory cells 105. The memory controller 140 is described below as performing the method 250, but it should be understood that any suitable processing circuit may additionally or alternatively perform the method 250. Furthermore, although the method 250 is described below as being performed in a particular order, it should be understood one or more of the steps of the method 250 may, for example, be omitted or reordered.

At block 252, the memory controller 140 may receive an address that targets the memory cell 105. The address may be a logical address that is converted by the memory controller 140 into a physical address. The memory controller 140 may use the physical address to make certain control decisions. For example, at block 254, the memory controller 140 may use the physical address to determine which row decoders 120 and column decoders 130 to use to select the memory cell 105.

In conjunction with block 254, the memory controller 140 may look-up an indication of the row decoders 120 and column decoders 130 in a memory, such as through use of a query of a database, and/or perform address arithmetic, to determine which row decoders 120 and column decoders 130 corresponds to the physical address of the memory cell 105 (e.g., is located closest to the physical address of the memory call). The database may have been populated at a time of manufacturing of the memory device 100 and/or adjusted during operation of the memory device 100 to reflect any logical-to-physical address assignments.

At block 256, the memory controller 140 may use the row decoders 120 and column decoders 130 to transmit a selection current to a target memory cell of the memory cells 105. The memory controller 140 may leverage physical distances between the memory cells 105 and the row decoders 120 and column decoders 130 to minimize an impact that activation of the row decoders 120 and column decoders 130 initially has on the memory cells (e.g., to reduce current spikes). Furthermore, each of the memory cells 105 may correspond to two column decoders 130 for its corresponding of the bit lines 115 and two row decoders 120 for its corresponding of the word lines 110. The memory controller 140 may leverage factors discussed above to determine which of the two decoders for the bit lines 115 and the word lines 110 may be activated.

At block 258, the memory controller 140 may employ sense components 125 and/or 126 to determine if the target memory cell 105 has been selected correctly by row decoders 120 and column decoders 130. In some embodiments, the sense components are coupled directly to the word lines 110 and bit lines 115 to ensure correct sensing of the selection current being transmitted to the target memory cell.

Figure 4:
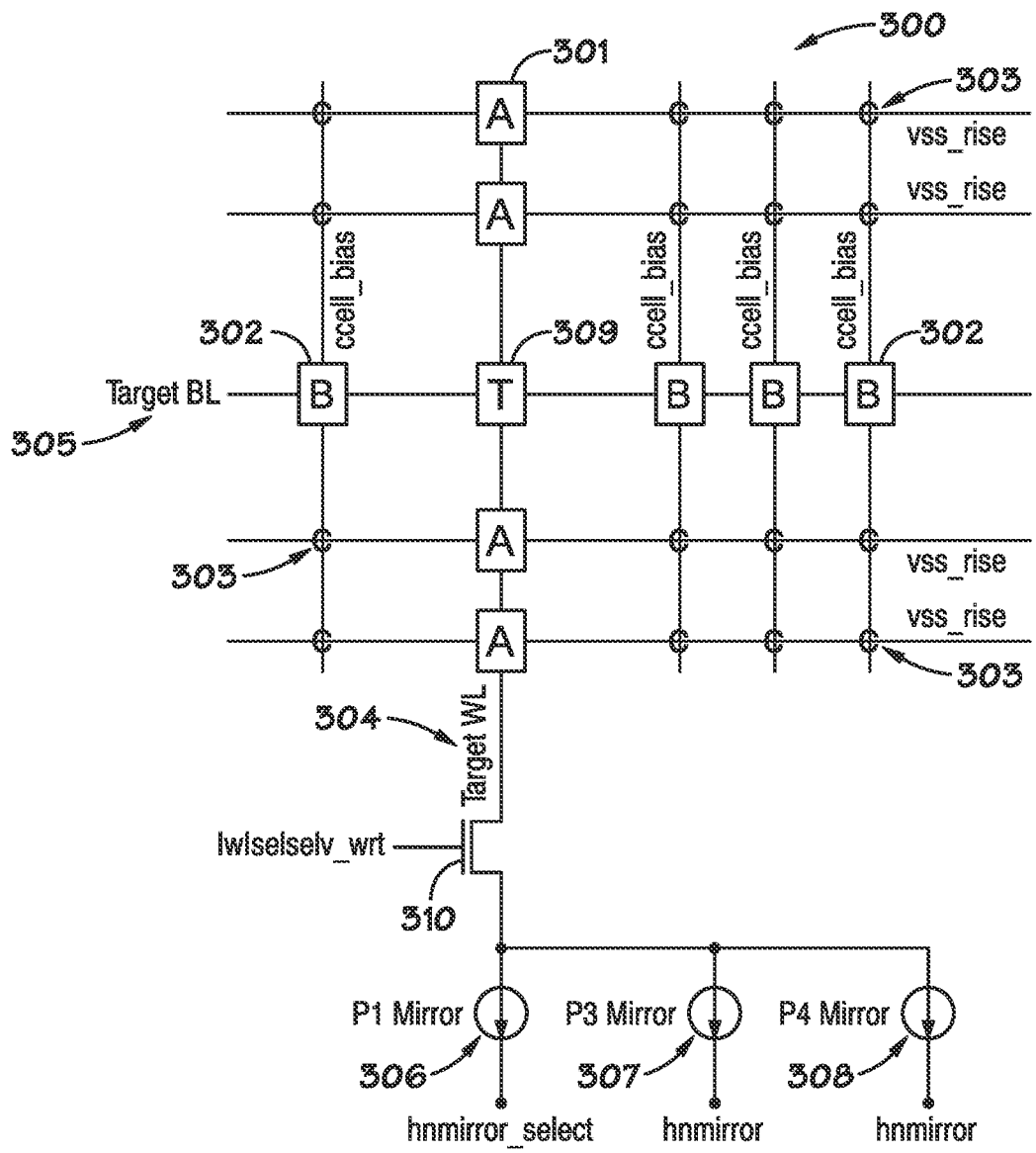
FIG. 4 is a diagram of a first embodiment of a portion of the memory array of FIG. 2, in accordance with an embodiment of the present disclosure.

With the foregoing in mind, FIG. 4 is a simplified array schematic showing a portion of the 3D memory array 102 as array 300, whereby the memory cells 105 are represented by a target memory cell 309 to be selected, for example, by the memory controller 140, as well as surrounding A-cells 301, B-cells 302, and C-cells 303. The A-cells 301 may represent memory cells 105 that are located on a target word line 304 (e.g., a common or selected word line 110) with the target memory cell 309 and the B-cells 302 may represent memory cells 105 that are located on the target bit line 305 (e.g., a common or selected bit line 115) with the target memory cell 309. The C-cells 303 may represent memory cells 105 that are located on a different word lines and bit lines from the target memory cell 309. In some embodiments, the target word line 104 may be selected via a switch 310 that is controlled via, for example, the memory controller 140 and couples a higher voltage (e.g., 0V) through a current mirror, e.g., P1 mirror 306, to a lower voltage (e.g., −4V) as the mirror select voltage.

Coupled to the array 300 is a set of current mirrors that may be utilized in conjunction with the operations of the array 300 (e.g., selections, read, writes, etc.). The set of current mirrors, as illustrated, include a P1 mirror 306, a P3 mirror 307, and a P4 mirror 308, which may be NFET devices in some embodiments. It may be important to note that these current mirrors may be represented as separate current mirrors, but in practice may be a single, physical current mirror that has multiple different current trims as inputs into the gate. The P1 mirror 306 may operate in conjunction with a selection operation (i.e., selection of the target memory cell 309), whereby the P1 mirror 306 provides the selection current to the target word line 304 and the target memory cell 309. The P3 mirror 307 and P4 mirror 308 may be programming mirrors whereby, for example, the P3 mirror 307 operates in conjunction with growth and the P4 mirror 308 operates in conjunction with setback. Growth using the P3 mirror 307 may, for example, correspond to continuing nucleation for one or more memory cells 105, which may, for example, have been initiated in a programming operation via the P1 mirror 306. Nucleation is a thermodynamic changing of a phase of a material, for example, starting from an amorphous state (e.g., a disorderly phase of the material of the memory cells 105), rising the temperatures cause formation of crystallites (e.g., an orderly phase of the material of the memory cells 105) causing a phase change to the memory cells 105. The setback using the P3 mirror 307 may, for example, correspond to resetting of a memory state of a memory cell 105 to a low Vt state once the growth has been completed.

In operation, issues may arise when leakage from the A-cells 301 when selection of the target cell 309 is undertaken. That is, a voltage difference across the A-cells 301 may cause leakage current. Moreover, the respective leakage currents of the A-cells 301 is cumulative, such that the sum of the leakage currents along the target word line 304 may be, for example, rise to an amount as much as approximately 14-20 μA or even larger amounts. This may potentially cause issues since, for example, during selections of a memory cell 105 (e.g., selecting the target memory cell 309), the P1 mirror 306 may provide a current that the target memory cell 309 sees (i.e., has applied thereto) and the A-cell 301 leakage currents may be close to (or in some cases, exceed) the current provided by the P1 mirror 306 to pull the target word line 304 down.

Furthermore, A-cell 301 leakage and its strains on the P1 mirror 306 can also increase in the presence of an effect called VSS rise. When the BL voltage ramps to the highest voltage, hpvpp, to ensure selection success, C-cell 303 bias from VDD (e.g., 1.2V) also should be applied on the deselected word lines 110 to avoid false selection on B-cells 302. Intransient C-cells 303 typically rise to approximately 400 mV-800 mV, which also pulls VSS up by approximately 200 mV-400 mV. VSS rise increases A-cell 301 sub-threshold leakage affects the negative word line 110 voltage delivery through the P1 mirror 306. This may additionally lead to a failure to properly select the target memory cell 309.

Figure 5:
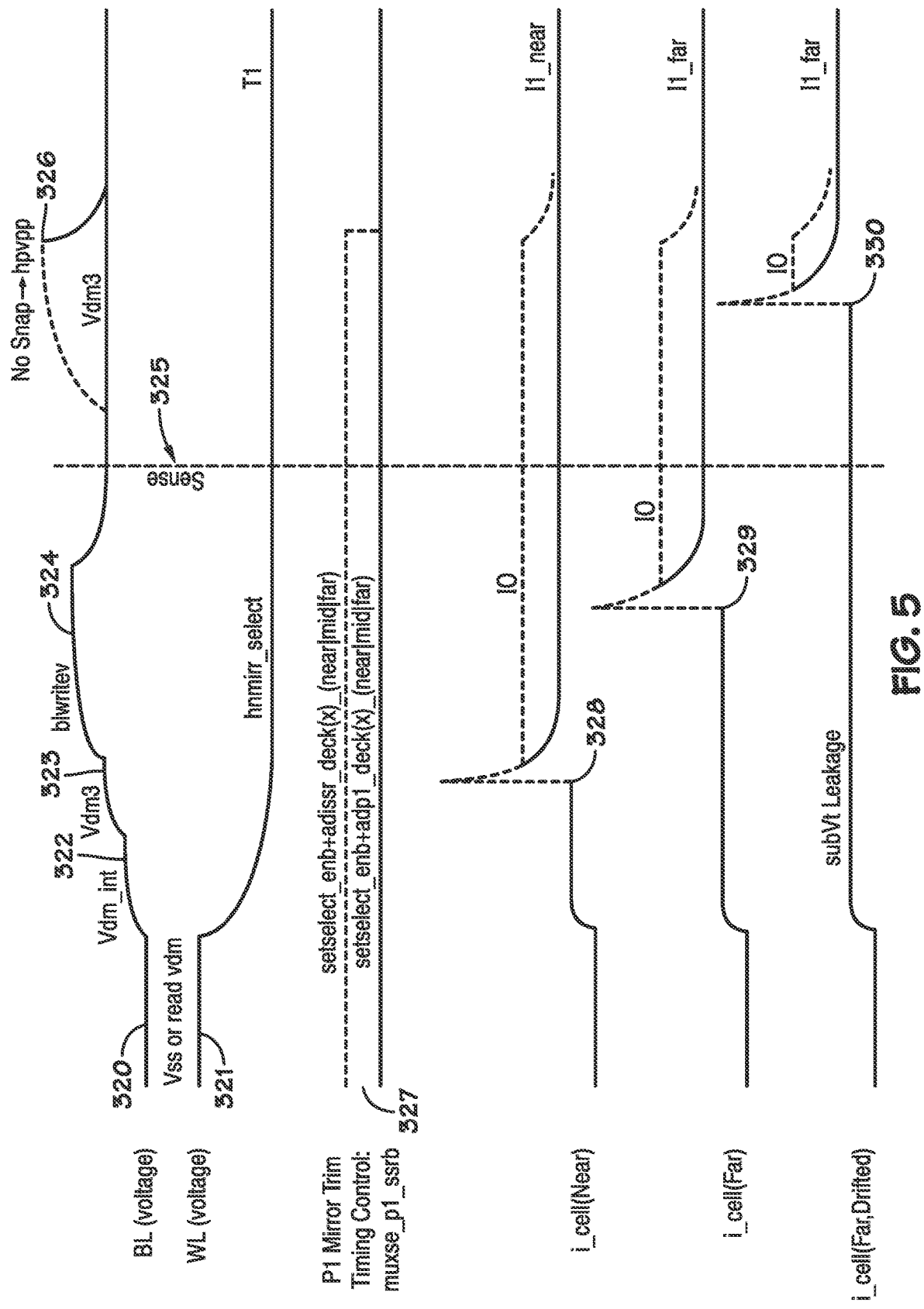
FIG. 5 illustrates an example of the selection of the target memory cell of FIG. 4, in accordance with an embodiment of the present disclosure.

FIG. 5 illustrates the selection process of the target memory cell 309 using the P1 mirror 306. The selection process may begin by the column decoder 130 setting the bit line voltage 320 to a default read VDM voltage, vdm_int 322. Next, the column decoder 130 may cause the vdm_int 322 to be ramped up. The ramping up of vdm_int 322 may, in some embodiments, be divided to a midlevel ramp voltage (vdm3 323) to achieve a staircase-like pulse before reaching the bit line write voltage, blwritev 324. The staircase-like effect has the benefit of minimizing spike current generation and the respective staircase levels may be chosen to control a desired ratio of spike current based on whether the target memory cell 309 is near (i.e., relatively close in proximity to the column decoder 130 and/or relatively close in proximity to the row decoder 120) or whether the target memory cell 309 is far (i.e., relatively far in proximity from the column decoder 130 and/or relatively far in proximity from the row decoder 120). As used herein, near (i.e., relatively close in proximity to the column decoder 130 and/or relatively close in proximity to the row decoder 120) includes the target memory cell 309 as being one of the approximately 5%, approximately 10%, approximately 15%, approximately 20%, approximately 25%, approximately 30%, approximately 35%, or approximately 40% of memory cells closest in proximity to the column decoder 130 along a bit line 115 and/or the row decoder 120 along a word line 110. Likewise, as used herein, far (i.e., relatively far in proximity from the column decoder 130 and/or relatively far in proximity from the row decoder 120) includes the target memory cell 309 as being one of the approximately 5%, approximately 10%, approximately 15%, approximately 20%, approximately 25%, approximately 30%, approximately 35%, or approximately 40% of memory cells farthest in proximity to the column decoder 130 along a bit line 115 and/or the row decoder 120 along a word line 110. Use of a multi-step ramp (i.e., the staircase-like pulse) may, accordingly, provide gains in endurance of the memory cells 105.

As the vdm_int 322 is being ramped up (e.g., via a staircase-like pulse), the target word line 304 drops from, for example, 0V to the mirror select voltage (i.e., hnmirr_select voltage of, for example, approximately −4V). If the target memory cell 309 is a near cell, it may snap while the bit line voltage 320 corresponds to the midlevel ramp voltage vdm3 323. This snap may correspond to voltage applied the target memory cell 309 reaching a level at which resistance across the target memory cell 309 decreases, thus allowing for current flow through the target memory cell 309 at time 328. This snap may be detected in a snap detection circuit (e.g., which may be or may include a current sensor, a current detector, or the like) at time 325 and the snap detection circuit may be disposed in, for example, the sense component 125. Likewise, if the target memory cell 309 is a far cell, it may snap while the bit line voltage 320 corresponds to the ramped voltage of bit line write voltage, blwritev 324 at time 329. This snap may be detected in the snap detection circuit at time 325. It should be noted that the bit line voltage 320 may be ramped back down to the midlevel ramp voltage vdm3 323 in conjunction with the sense operation to correctly detect if the target memory cell 309 has snapped at time 325.

If the target memory cell 309 has snapped and that snap has been detected at time 325, programming of the target memory cell 309 may proceed. However, in some situations, the target memory cell 309 has not snapped at time 325. For example, if the target memory cell is far and has drifted (i.e., if there has been resistance drift in the target memory cell 309 that causes the target memory cell 309 to resist snap at the bit line write voltage, blwritev 324), an additional voltage is applied to ramp up the bit line voltage 320 from the midlevel ramp voltage vdm3 323 to a high voltage hpvpp 326 to induce a snap within the memory cell. The high voltage hpvpp 326 may, in some embodiments, represent the maximum voltage that the column decoder 130 may provide as the bit line voltage 320 to snap the target memory cell 309, as represented at time 330.

As discussed above, the snap detection circuit may be present on the bit line side (e.g., corresponding to a positive side), for example, in the sense component 125. However, in conjunction with FIGS. 4 and 5, there may not be present any snap detection circuit on the word line 110 side (e.g., corresponding to a negative side) of the array 332. Accordingly, any sequence for the word line 110 side is instead predetermined as instructions (e.g., providing predetermined trims to one or more of the P1 mirror 306, the P3 mirror 307, and the P4 mirror 308 at predetermined times, whereby the trims (or trim signals) are input signals (e.g., control signals) to control the amount of the current for the current mirrors P1 mirror 306, P3 mirror 307, and P4 mirror 308). This has the effect of having mirror trim transitions be blind (i.e., be executed at predetermined times instead of, for example, based on an actual time at which the snap of the target memory cell 309 occurs). Moreover, as transitions of the current mirrors P1 mirror 306, P3 mirror 307, and P4 mirror 308 take time (e.g., one or more ms) to adjust to a new current in response to a new trim being applied, when this is coupled with initiating the trim transitions at predetermined times, extra time is expended, which may cut into other operating time periods (e.g., time for nucleation) and reduce efficiency of the 3D memory array 102. Thus, for example, the trim 327 for the P1 mirror 306, as illustrated in FIG. 5, continues until after time 330 to insure that the target memory cell 309 has snapped, reducing potential efficiency gains that may be present when the target memory cell 309 snaps instead at time 328 or 329. Finally, the adjustment of trims in conjunction with FIG. 4 and FIG. 5 also typically utilizes existing available trims, such as read or write trims, which may limit the current adjustments that may be chosen for the current mirrors P1 mirror 306, P3 mirror 307, and P4 mirror 308.

Figure 6:
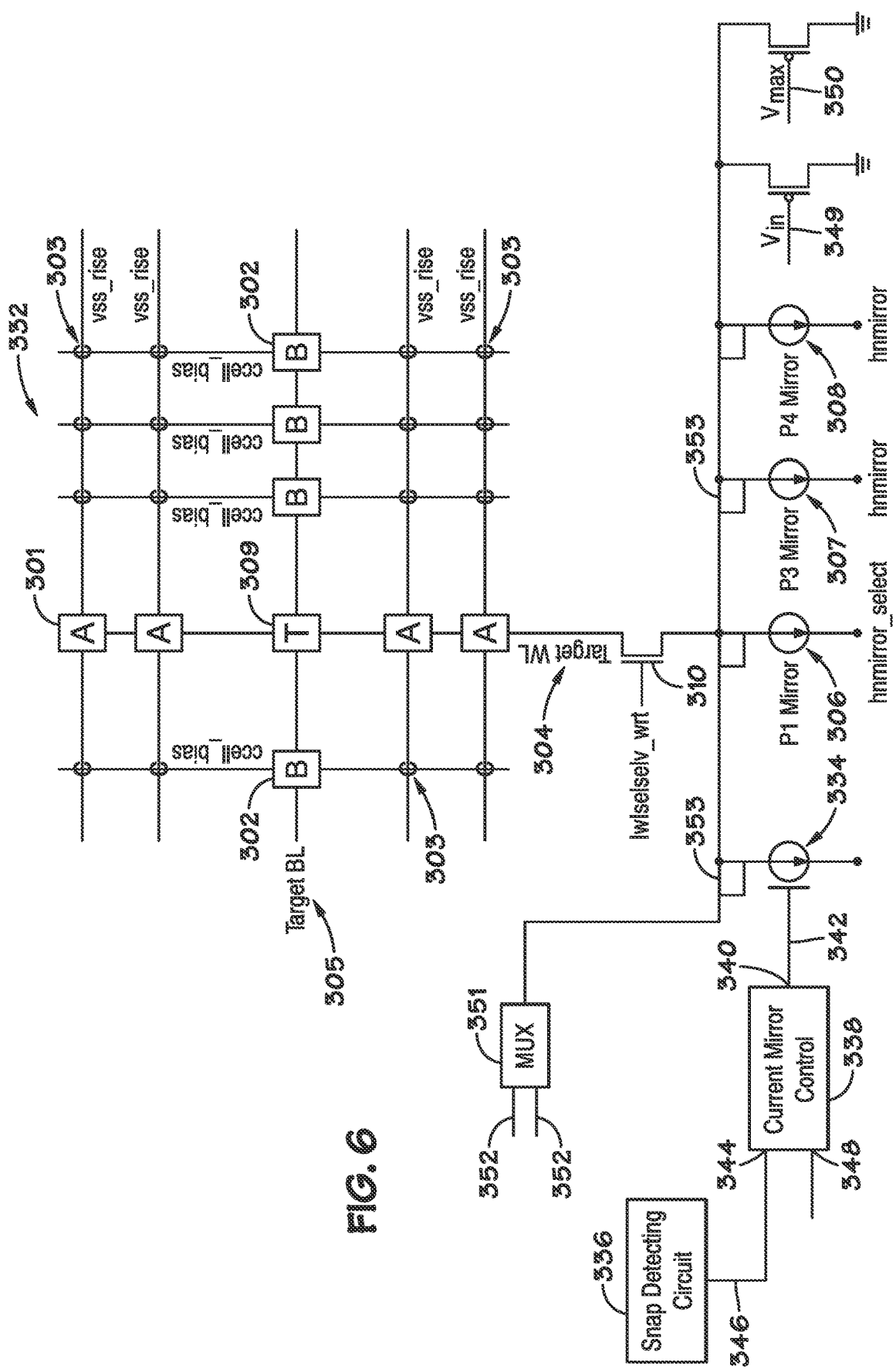
FIG. 6 is a diagram of a second embodiment of a portion of the memory array of FIG. 2, in accordance with an embodiment of the present disclosure.

FIG. 6 illustrates a second embodiment a portion of the 3D memory array 102 as array 332. Array 332 is similar to array 300 in that it includes memory cells 105 represented by the target memory cell 309 to be selected, for example, by the memory controller 140, as well as surrounding A-cells 301, B-cells 302, and C-cells 303. Similarly, the array 332 includes target word line 304, target bit line 305, and the P1 mirror 306, the P3 mirror 307, and the P4 mirror 308. The array 332 additionally includes at least one additional current mirror 334.

The array 332 may operate more efficiently when different currents are utilized to implement different operations, for example, using a first current in conjunction with a selection operation and utilizing a second current with a programming operation. For example, due to A-cell 301 leakage currents, a relatively higher current may be implemented to prevent the A-cell 301 leakage currents from saturating the current mirror being utilized, for example, current mirror 334, in selection of the target memory cell 309. Additionally, when the target memory cell 309 is far (i.e., relatively far in proximity from the column decoder 130 and/or relatively far in proximity from the row decoder 120), higher currents (e.g., between approximately 45 µA and 65 µA) are utilized to snap the cell versus a lower current (e.g., between approximately 25 µA and 35 µA) that is utilized to snap the target memory cell 309 when the target memory cell 309 is near (i.e., relatively near in proximity to the column decoder 130 and/or relatively near in proximity to the row decoder 120). This may be due to, for example, a voltage drop (IR drop) due to the A-cell 301 leakage current and the resistance of the line (e.g., the target word line 304). That is, the further the target memory cell 309 is along the target word line 304 (e.g., further away from the row decoder 120), the greater the resistance of the target word line 304 will be, causing a larger voltage drop. Therefore, utilization of a current mirror, for example, current mirror 334, having a higher current than the currents of the current mirrors P1 mirror 306, P3 mirror 307, and P4 mirror 308 in this situation is also beneficial.

Furthermore, the target word line 304 ramp rate is affected by the current mirror utilized. When the current mirror during a target memory cell 309 selection operation pulls the voltage down, the parasitic for the tile (e.g., all of the memory cells 105 of the target word line 304) is also pulled down. Additionally, there is a correlation between the rate of the change in voltage over the change in time (dV/dT) to the amount of current of the current mirror being utilized. Furthermore with greater values of dV/dT (i.e., faster transitions), larger current spikes are realized when the target memory cell 309 snaps (when the target memory cell 309 is near), which may negatively affect the endurance of the memory device 100. As similar current spikes are not present when the target memory cell 309 is far, utilization of a current mirror, for example, current mirror 334, having a higher current than the currents of the current mirrors P1 mirror 306, P3 mirror 307, and P4 mirror 308 in a selection operation when the target memory cell is far is beneficial while utilization of a current mirror, for example, current mirror P1 mirror 306 in a selection operation when the target memory cell is near is beneficial as it may improve the lifespan (endurance) of the memory device 100, specifically the 3D memory array 102. It should be noted that while current mirror 334 has been discussed, similar advantages may be present when a further additional current mirror is utilized and which has a different current than, for example, current mirror 334 and P1 mirror 306. This may allow for greater granularity in selection of the current output for selection and/or programming operations.

Additional benefits may accrue from the use of the current mirror 334 (or another additional current mirror) in programming operations (e.g., nucleation). The initial programming after a target memory cell 309 is selected may be nucleation in conjunction with a set operation on the target memory cell 309. A set operation may include crystallization of a memory cell 105 to reach a crystalline state (with lower resistance) while a reset operation may return the memory cell 105 to an amorphous state (with greater resistance). The set operation generally consumes more time to complete than the reset operation. Therefore, the set operation may viewed as being time sensitive and improvements in the start time to initiate the set operation are advantageous, as it speeds up the operation of the memory device 100. For example, by being able to determine a snap of the target memory cell 309 accurately, the set operation may be initiated subsequent to the snap of the target memory cell 309 instead of being initiated at a predetermined time thereafter. This may provide a more rapid transition to the set operation relative to utilization of predetermined times to initiate the set operation.

For at least the above described reasons, utilization of the current mirror 334 as an additional selection mirror in addition to the P1 mirror 306 is advantageous. By including the current mirror 334 having a different current than, for example, the P1 mirror 306, different currents are available for use in selection and programming operations. Moreover, by having individual current mirrors each tailored to provide different currents, delays associated with alteration of a current of a given current mirror, for example, P1 mirror 306, via different trims may be avoided. Moreover, to obtain additional efficiency gains, in some embodiments, an additional snap detection circuit 336 may be present on the word line 110 side (e.g., corresponding to a negative side), for example, in the sense component 126. This snap detection circuit 336 (e.g., which may be or may include a current sensor, a current detector, or the like) may detect a snap in the target memory cell 309 to allow for more rapid transitions of switching between current mirrors, for example between current mirror 334 and P1 mirror 306 or P3 mirror 307. The snap detection circuit 336 may transmit a snap detection signal indicative of the occurrence of the snap.

In some embodiments, the current mirror 334, P1 mirror 306, P3 mirror 307, and P4 mirror 308 are controlled by a current mirror control circuit 338. The current mirror control circuit 338 may be disposed in, or part of, the memory controller 140 and it may be a controller or other logic device that generates signals to control the current mirror 334, P1 mirror 306, P3 mirror 307, and P4 mirror 308. In some embodiments, the current mirror control circuit 338 may operate to activate the current mirror 334, P1 mirror 306, P3 mirror 307, and P4 mirror 308 and/or the current mirror control circuit 338 may operate to generate as well as transmit trims from an output 340 along path 342 for control of the current mirror 334, P1 mirror 306, P3 mirror 307, and P4 mirror 308, for example, to allow for the use of the current mirror 334, P1 mirror 306, P3 mirror 307, and P4 mirror 308 in various operations (e.g., current mirror 334 and the P1 mirror in target memory cell 309 selection and the subsequent nucleation). The current mirror control circuit 338 may also include an input 344 that is coupled to the snap detection circuit 336 via path 346 (e.g., an electrical line). Likewise, the current mirror control circuit 338 may include an input 348 that receives location information (e.g., near or far) of the target cell.

In operation, the current mirror control circuit 338 receives location information regarding the target memory cell 309 (i.e., whether it is near or far) and is able to generate a corresponding trim based thereon to effect selection of the target memory cell 309. In some embodiments, the location of the target memory cell 309 is determined during address decoding and the address (or an indication of whether it is near or far) is transmitted to the current mirror control circuit 338. Likewise, in operation, the current mirror control circuit 338 receives snap detection information (e.g., via a signal) from the snap detection circuit 336 along path 346 at the input 344. This snap detection information is an indication that snap of the target memory cell 309 has occurred. The current mirror control circuit 338 may thereafter (e.g., dynamically) transition a trim to a programming operation trim that is transmitted to the selected current mirror (e.g., to initiate the programming operation and corresponding nucleation).

In other embodiments, one or more voltage sources may be utilized and swapped between to ramp up voltage outputs to generated tailored current outputs similar to the current outputs of the current mirrors discussed above. The type of voltage sources utilized may be source followers. Voltage sources may provide a stable voltage source that does not require the same amount of time to ramp up to a required voltage for current output as the discussed current mirrors and instead more quickly and reliably provide the voltage needed to generate the correct current for selection. An example of this embodiment may be represented by source follower 349 and the source follower 350 configured to output respective voltages required to snap a target cell 309. In some embodiments, one or more of the source follower 349 and the source follower 350 can be selected separately from the current mirror 334 or, for example, one of the source follower 349 or the source follower 350 may be toggled for one or more clock cycles with the current mirror 334 (e.g., the source follower 349 may be activated and coupled to the array 332 for a predetermined period of time and a source control multiplexer 351 may switch selection from the source follower 349 as a voltage source to selection of the current mirror 349 as a voltage source coupled to the array 332).

The voltage sources and current mirrors may connect directly to the source control multiplexer 351 that controls which current mirror and/or voltage sources are selected. The source control multiplexer 351 may have two or more inputs 352 to determine which voltage source and/or current mirror are selected for use. On the paths between the source control multiplexer 351, the current mirrors, and the voltage sources are transmission gates 353 (e.g., switches or other pass gates) which may be located between each junction between the path from the source control multiplexer 351 to each individual current mirror or voltage source. These transmission gates 353 may operate as switches, controlled by the output of the source control multiplexer 351, to have the respective voltage source (e.g., current mirror or source follower) coupled thereto connect to the array 332. It should be noted that because two inputs 352 are illustrated, only four corresponding transmission gates 353 are present (e.g. in an embodiment where the source follower 349 and the source follower 350 are not connected or are not present). However, when the source follower 349 and the source follower 350 are present, each one may be coupled to the source follower 349 or the source follower 350 via a respective transmission gate 353 to the source control multiplexer 351, which may also include an additional input 352 for selection of up to eight voltage sources (e.g., current mirrors and source followers). One technique to effect the selection operation and corresponding switch to a programming operation for a target memory cell 309 is described below in conjunction with FIG. 7.

FIG. 7 illustrates a method 350 of implementing a selection and programing operation for a target memory cell 309. In step 352, selection of a current mirror is performed, for example, by the current mirror control circuit 338. In certain embodiments, selection of a voltage source and/or the current mirror may be performed by the source control multiplexer 351. This selection of the current mirror and/or voltage source (or a toggled selection thereof) may be based on, for example the location information regarding the target memory cell 309 (i.e., whether it is near or far). For example, the current mirror 334 (or another additional current mirror or source follower 349 or source follower 350) may be selected in step 352 when the target memory cell 309 is determined to be far whereas P1 mirror 306 may selected in step 352 when the target memory cell 309 is determined to be near. This will allow for particularly tailored currents to be applied to the target memory cell 309 based on its location, which operates to improve the longevity of the device (as previously noted). Step 352 may additionally, include, for example, the initiation of the selection operation of the target memory cell 309.

In step 354, an indication of a snap is received, for example, by the current mirror control circuit 338 or the source control multiplexer 351. In some embodiments, this snap indication is received as snap detection information from the snap detection circuit 336 along path 346 at the input 344 and in other embodiments, this snap detection is received as snap detection information at one of the inputs 352 into the source control multiplexer 351. The snap detection circuit 336 may be continuously monitoring the target memory cell 309 and transmit the indication when it is detected. Alternatively, the snap detection circuit 336 may sense for the snap at predetermined times during the ramping of the bit line voltage 320. For example, sense operation may occur a snap detection may occur at or approximately at time 328, at or approximately at time 329, at or around time 325, and/or at or around time 330 and the sense operation is performed by the snap detection circuit 336 (e.g., in addition to any sense operation at time 325 by the snap detecting circuit described in conjunction with FIG. 5).

In step 356, transitioning to a programming operation occurs. Step 356 may include altering the trim of the current mirror selected in step 352 to initiate the programming operation. Alternatively, step 356 may include selecting a new current mirror and transmitting a programming trim to the newly selected current mirror to initiate the programming operation. Determination of the current mirror to be selected may, in some embodiments, be based on whether the target memory cell 309 is near or far and/or the current outputs of the respective current mirrors.

In some embodiments, an additional step 358 may be performed as part of the method 350. If the target memory cell failed to select in step 354, a new current mirror or a new voltage source may be selected and step 354 may be repeated. Step 358 may be undertaken when a condition, such as an amount of time lapsed, has occurred. In step 358, the current mirror control circuit 338 selects the new current mirror that is coupled to, for example, a more negative voltage source, since the current mirror 334, the P1 mirror 306, the P3 mirror 307, and/or the P4 mirror 308 may be driven by different voltage sources. Additionally, in step 358, the source control multiplexer 351 may connect, via a selected switch that is activated, the new current mirror and/or voltage source. This will allow for use of a greater voltage source when necessary while also providing lesser voltage sources at other times, thus reducing overall power consumption relative to using the greater voltage source at all times.

As discussed above, in step 354, the indication of the snap is received. However, in some embodiments, a technique may be implemented in which the received snap indications are counted, i.e., counter based snap detection. This step may be perpetuated among multiple cells across entire arrays, tiles that contain multiple arrays, and partitions that contain multiple tiles. The snap detection circuitry may count an amount of cells that snap in every step 354 of each cell of a defined amount of cells and utilize the percentage of cells that snapped versus cells that did not snap to adjust selection biasing. That is, the additional step 358 may be influenced by the percentage of cells that snapped and subsequent selection of voltage sources (i.e., different current mirrors and/or source followers) are affected by the percentage of cells that snapped so as to correct for drift and/or other factors (i.e., to increase the selection bias to counteract drift). By detecting snap counts (e.g., whether a threshold percentage of cells snapped), a more tailored selection bias can be applied that corresponds to that threshold percentage of cells that have snapped. Thus, the snap detection in step 354 can, in some embodiments, be a counter based (e.g., statistical based) count detection.

By employing the techniques described in the present disclosure, the systems and methods described herein may allow for improvement of the selection and programming process of phase change memory cells in 3D X-point architecture. The snap-detection sensing currents may allow for quick transitioning between current mirrors to ensure an increased nucleation time to allow for more programming time of the selected memory cell. The dedicated current mirror may overcome the saturation introduced by A-cell leakage from the memory array and may allow for consistent selection currents selecting the correct memory cells. Indeed, enabling the current mirror to be driven by a more negative voltage source may allow for higher levels of power efficiency across current mirrors. The techniques described in the present disclosure may lead to further improvements in 3D X-point technology and memory architecture as a whole.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising a plurality of memory elements;
a first circuit that when in operation selectively applies a first voltage to a word line of the memory array to select a target memory cell as a first memory element of the plurality of memory elements when the target memory cell is at a first location in the memory array, wherein the first circuit comprises a first current mirror; and
a second circuit that when in operation selectively applies a second voltage to the word line of the memory array to select the target memory cell as the first memory element of the plurality of memory elements when the target memory cell is at a second location in the memory array, wherein the second circuit comprises a second current mirror.

2. The memory device of claim 1, wherein the first circuit when in operation receives a first trim signal as a control signal to apply the first voltage at a first time.

3. The memory device of claim 2, wherein the first circuit when in operation receives a second trim signal as a second control signal to apply a third voltage to the word line of the memory array at a second time subsequent to the target memory cell being selected.

4. The memory device of claim 2, wherein the second circuit when in operation receives a second trim signal as a second control signal to apply a third voltage to the word line of the memory array at a second time subsequent to the target memory cell being selected.

5. The memory device of claim 1, wherein the second circuit when in operation receives a first trim signal as a control signal to apply the second voltage at a first time.

6. The memory device of claim 5, wherein the second circuit when in operation receives a second trim signal as a second control signal to apply a third voltage to the word line of the memory array at a second time subsequent to the target memory cell being selected.

7. The memory device of claim 5, wherein the first circuit when in operation receives a second trim signal as a second control signal to apply a third voltage to the word line of the memory array at a second time subsequent to the target memory cell being selected.

8. The memory device of claim 1, comprising a third circuit that when in operation selectively generates a third voltage to select the target memory cell as the first memory element of the plurality of memory elements.

9. The memory device of claim 1, wherein the first circuit when in operation generates the first voltage to select the target memory cell as the first memory element of the plurality of memory elements when a location of the target memory cell is near in proximity to a row decoder of the memory device.

10. The memory device of claim 9, wherein the second circuit when in operation generates the second voltage to select the target memory cell as the first memory element of the plurality of memory elements when the location of the target memory cell is far in proximity to the row decoder of the memory device.

11. A memory device, comprising:
a memory array comprising a plurality of memory elements organized into word lines and bit lines;
a snap detection circuit coupled to the word lines of the memory array, wherein the snap detection circuit in operation detects a snap in a target memory cell;
a first circuit that when in operation selectively applies a voltage to a first word line of the word lines in conjunction with a selection operation to select the target memory cell of the word line as a first memory element of the plurality of memory elements;
a second circuit that when in operation selectively applies a second voltage to the first word line of the memory array in conjunction with the selection operation to select the target memory cell of the word line as the first memory element of the plurality of memory elements; and
a control circuit comprising a first input coupled to the snap detection circuit and an output coupled to the first circuit and the second circuit.

12. The memory device of claim 11, wherein the control circuit comprises a second input that when in operation receives location information of a location of the target memory cell with respect to a row decoder coupled to the first word line.

13. The memory device of claim 12, wherein the control circuit when in operation transmits a first trim signal to the first circuit to control output of a first current to the first word line of the memory array to select the target memory cell of the word line as the first memory element of the plurality of memory elements at a first time when the location information has a first value.

14. The memory device of claim 13, wherein the control circuit when in operation transmits a second trim signal to the second circuit to control output of a second current to the first word line of the memory array to select the target memory cell of the word line as the first memory element of the plurality of memory elements at the first time when the location information has a second value.

15. The memory device of claim 14, wherein the control circuit when in operation receives a snap detection signal at the first input from the snap detection circuit in response to the snap detection circuit detecting a snap of the target memory cell when the snap of the target memory cell occurs.

16. The memory device of claim 15, wherein the control circuit when in operation transmits a third trim signal to the first circuit to control output of a third current to the first word line of the memory array to program the target memory cell based upon the snap detection signal and the location information of the target memory cell.

17. The memory device of claim 15, wherein the control circuit when in operation transmits a third trim signal to the second circuit to control output of a third current to the first word line of the memory array to program the target memory cell based upon the snap detection signal and the location information of the target memory cell.

18. The memory device of claim 15, wherein the snap detection circuit transmits the snap detection signal at a predetermined time.

19. A method comprising:
   determining a physical location of a target memory cell in a word line of a memory array;
   applying a first voltage from a first circuit to the word line at a first time in conjunction with a selection operation to select the target memory cell when the physical location is determined to have a first characteristic;
   applying a second voltage from a second circuit to the word line at the first time in conjunction with the selection operation to select the target memory cell when the physical location is determined to have a second characteristic; and
   detecting a snap of the target memory cell when the snap of the target memory cell occurs.

20. The method of claim 19, comprising generating a snap detection signal indicative of the snap of the target memory cell.

21. The method of claim 20, comprising applying a third voltage from the first circuit to the word line in conjunction with a programming operation to initiate nucleation of the target memory cell based upon the snap detection signal.

22. The method of claim 19, comprises determining a threshold percentage of cell snaps of which the snap of the target memory cell is a portion thereof; and
   determining a selection bias value when the threshold percentage is at or above a predetermined value.

* * * * *